(12) United States Patent
Xu et al.

(10) Patent No.: US 6,495,903 B2
(45) Date of Patent: Dec. 17, 2002

(54) INTEGRATED CIRCUIT INDUCTOR

(75) Inventors: Shuming Xu, Santa Clara, CA (US);
Hanhua Feng, Singapore (SG); Pang Dow Foo, Singapore (SG); Bai Xu, Albany, NY (US); Uppili Sridhar, Sing (SG)

(73) Assignee: Institute of Microelectronics, Singapore Science Park II (SI)

( * ) Notice: Subject to any disclaimer, the term of this patent is extended or adjusted under 35 U.S.C. 154(b) by 0 days.

(21) Appl. No.: 09/737,439

(22) Filed: Dec. 13, 2000

(65) Prior Publication Data

US 2001/0045617 A1 Nov. 29, 2001

(30) Foreign Application Priority Data

May 25, 2000 (SG) .......................................... 20002874

(51) Int. Cl.⁷ .............................................. H01L 29/00
(52) U.S. Cl. ....................... 257/531; 257/533; 257/534; 257/538
(58) Field of Search ................................ 257/531, 533, 257/534, 538; 438/957, 255, 398, 665

(56) References Cited

U.S. PATENT DOCUMENTS

| | | | | |
|---|---|---|---|---|
| 5,539,241 A | | 7/1996 | Abidi et al. | |
| 5,831,331 A | * | 11/1998 | Lee | 257/277 |
| 6,153,489 A | * | 11/2000 | Park et al. | 438/381 |
| 6,180,433 B1 | * | 1/2001 | Furey et al. | 438/106 |
| 6,221,727 B1 | * | 4/2001 | Chan et al. | 257/531 |
| 6,242,791 B1 | * | 6/2001 | Jou | 257/531 |
| 6,274,920 B1 | * | 8/2001 | Park et al. | 257/277 |
| 6,287,931 B1 | * | 9/2001 | Chen | 438/381 |

FOREIGN PATENT DOCUMENTS

JP 05082736 A * 4/1993 .......... H01L/27/04

* cited by examiner

*Primary Examiner*—Olik Chaudhuri
*Assistant Examiner*—Nathan W. Ha
(74) *Attorney, Agent, or Firm*—Knobbe, Martens, Olson & Bear, LLP

(57) ABSTRACT

An inductor has a spiral aluminum track deposited on an oxide layer over a silicon substrate. The substrate is etched away to form a trench, which extends around beneath the track and provides an air gap having a low dielectric constant. The oxide layer has an inner region within the track, an outer region outside the track and a bridging region extending between the other regions. The bridging region is comprised of intact bridges and gaps therebetween, which are open to the trench and through which an etchant has access to the silicon substrate to form the trench by etching.

9 Claims, 5 Drawing Sheets

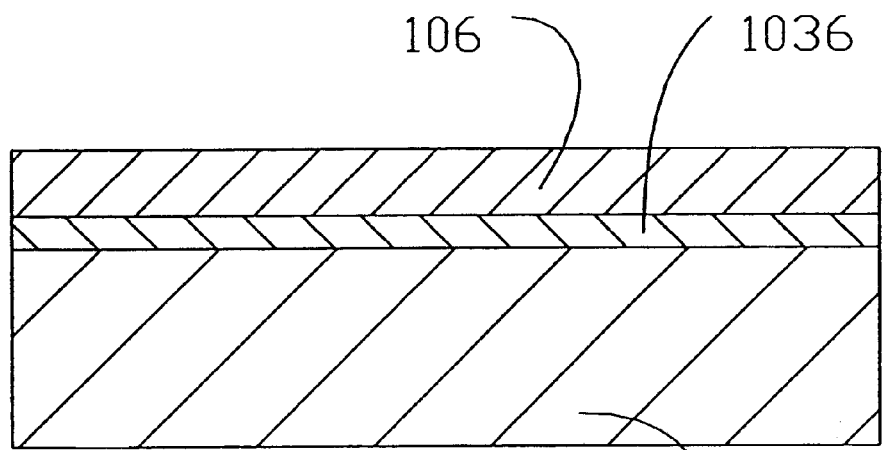
FIGURE 5(i)
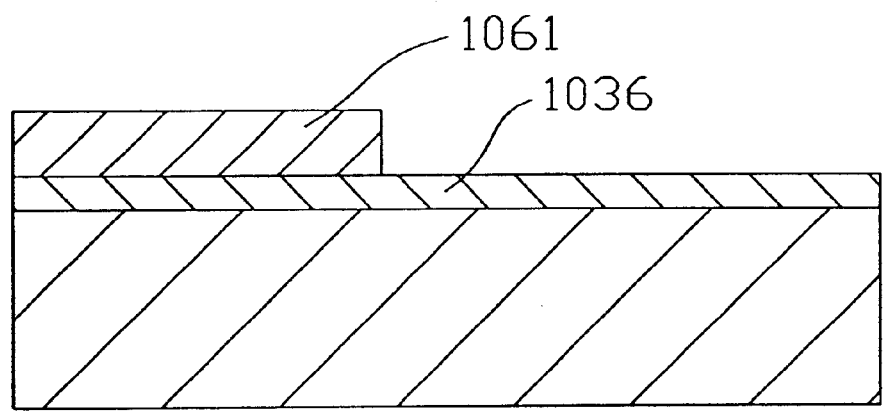
FIGURE 5(ii)
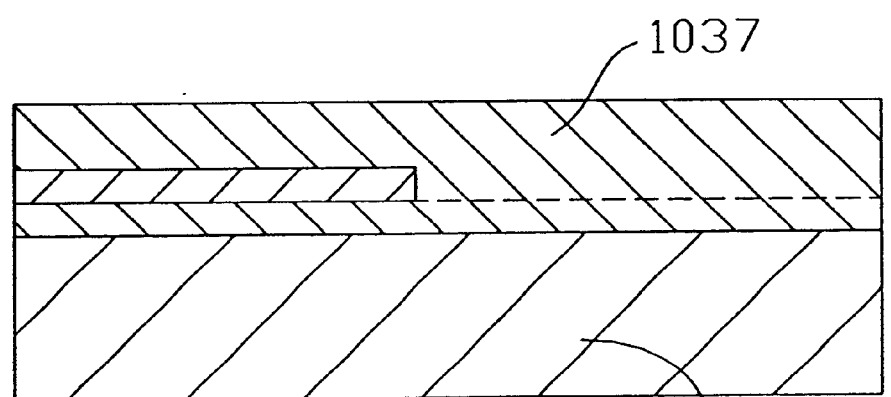
FIGURE 5 (iii)

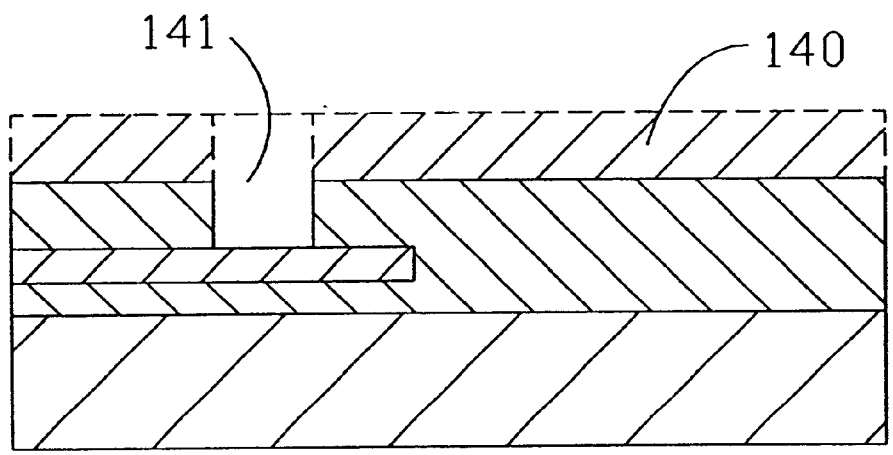
FIGURE 5(iv)
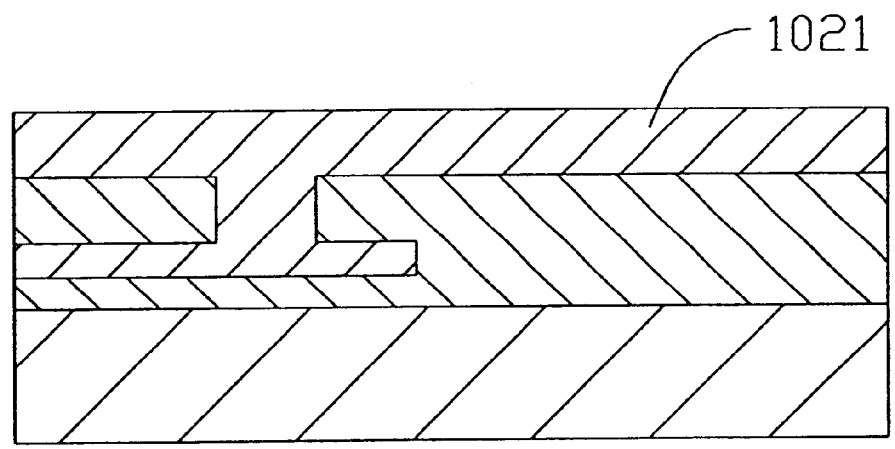
FIGURE 5(v)
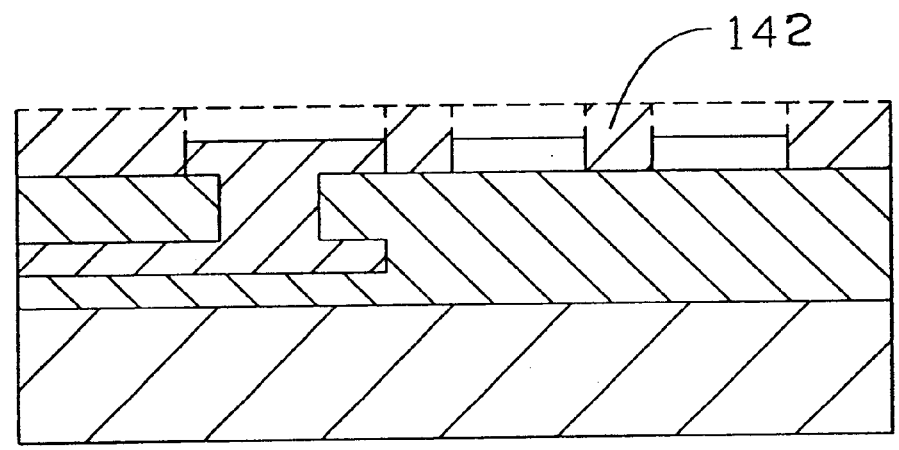
FIGURE 5 (vi)

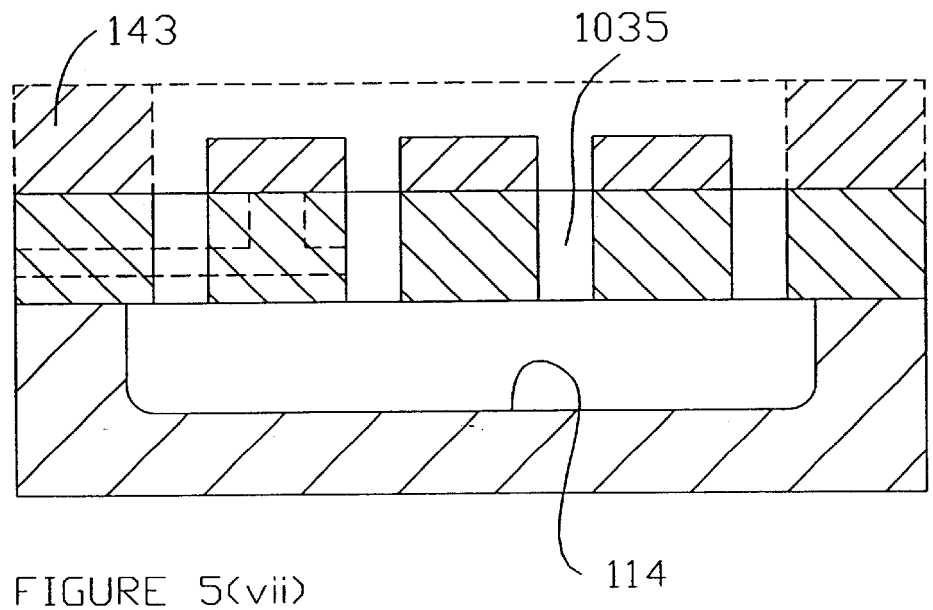
FIGURE 5(vii)

INTEGRATED CIRCUIT INDUCTOR

BACKGROUND OF THE INVENTION

1. Field of the Invention

The present invention relates to an integrated circuit inductor and a method of making the same.

2. Description of the Related Art

An integrated circuit inductor is an inductive component built up on a substrate in a similar manner to other components, and generally includes a spiral conductive trace. This arrangement has the disadvantage of high parasitic loss, in the form of resistive and capacitive loss to the semiconductor substrate on which the integrated circuit is built.

A solution to this problem is to selectively etch the silicon substrate beneath the conductive trace, as described in U.S. Pat. No. 5,539,241. This solution is shown in the accompanying drawings.

FIG. 1 is a plan view of an integrated circuit inductor 1 according to the prior art.

FIG. 2 is a cross-sectional view of the inductor 1 on the line II—II in FIG. 1.

Referring to the figures, the inductor 1 comprises a spiral aluminum track 2. The track 2 is laid down on an insulating oxide layer 3, which itself covers a semiconductor substrate 4. An underpass track 6 at a lower level in deposited layers making up the inductor 1 stretches from an inner end 5 to a connection 7. An outer end 8 is directly connected to another connection 9 at the same level. The spiral track 2 has a substantial extent. If the spiral track 2 is spaced from the semiconductor substrate 4 by a thickness of the insulating layer 3 alone, which has a comparatively high dielectric constant, the inductive track 2 has an appreciable distributed capacitance to the substrate 4. Hence, at high frequencies, the track 2 is liable to lose its inductive effect and acts as a capacitor.

In accordance with the improvement of the U.S. Patent, the oxide layer 3 has apertures 10 formed in it, with a track supporting portion 11 connected to the surrounding layer by bridges 12. Via the apertures 10, part of the substrate 4 is etched away, leaving an air gap 14 beneath the oxide portion 11. Thus, the inductive track 2 is widely spaced from the substrate 4, reducing the distributed capacitance thereto since air has a low dielectric constant.

Whilst this is a distinct improvement, the formation of the air gap 14 requires the use of aggressive chemicals and is made by a slow process. Further, the air gap 14 can be formed only in a post-fabrication step, because a liquid etchant required is not used in a CMOS fabrication. Accordingly, there is a need for an improved integrated circuit inductor and a method of producing thereof.

SUMMARY OF CERTAIN INVENTIVE ASPECTS

One of the objects of one embodiment of the invention is to provide an improved integrated circuit inductor and a method of making the same that satisfy the need.

The invention provides an integrated circuit inductor in an integrated circuit having a silicon substrate and an oxide layer on the silicon substrate The inductor comprises an inductive loop deposited on the oxide layer; apertures in the oxide layer beneath the inductive loop; bridges adjacent the apertures and provided by portions of the oxide between an inner region and an outer region of the oxide layer, respectively within and without the inductive loop, the loop being supported on the bridges; a trench formed in the silicon substrate beneath the bridges, to provide an air gap between the inductive loop and the silicon substrate.

Preferably, the apertures and the bridges generally extend radially of the inner region; and the trench extends circumferentially of the inner region.

Normally, the inductive loop has a plurality of spirally arranged turns; and the oxide layer includes an underpass connection in one of the bridges from a peripheral connection for one end of the inductor to its inner end.

The invention further provides a method of making an integrated circuit inductor in an integrated circuit having a silicon substrate and an oxide layer on the silicon substrate. The method comprises depositing the inductive loop on the oxide layer; opening the apertures in the oxide beneath the inductive loop and providing the bridges to support the loop; forming the trench in the silicon substrate beneath the bridges.

Preferably, the trench is formed by etching of the silicon substrate; and the etching is continued until the trench is continuous beneath the extent of the inductive loop.

BRIEF DESCRIPTION OF THE DRAWINGS

To help understand the invention, a specific embodiment thereof will now be described with reference to the accompanying drawings, in which:

FIGS. 5(i) to 5(vii) illustrate a series of steps in the production of the inductor of FIG. 3.

DETAILED DESCRIPTION OF CERTAIN INVENTIVE EMBODIMENTS

Figure 1:
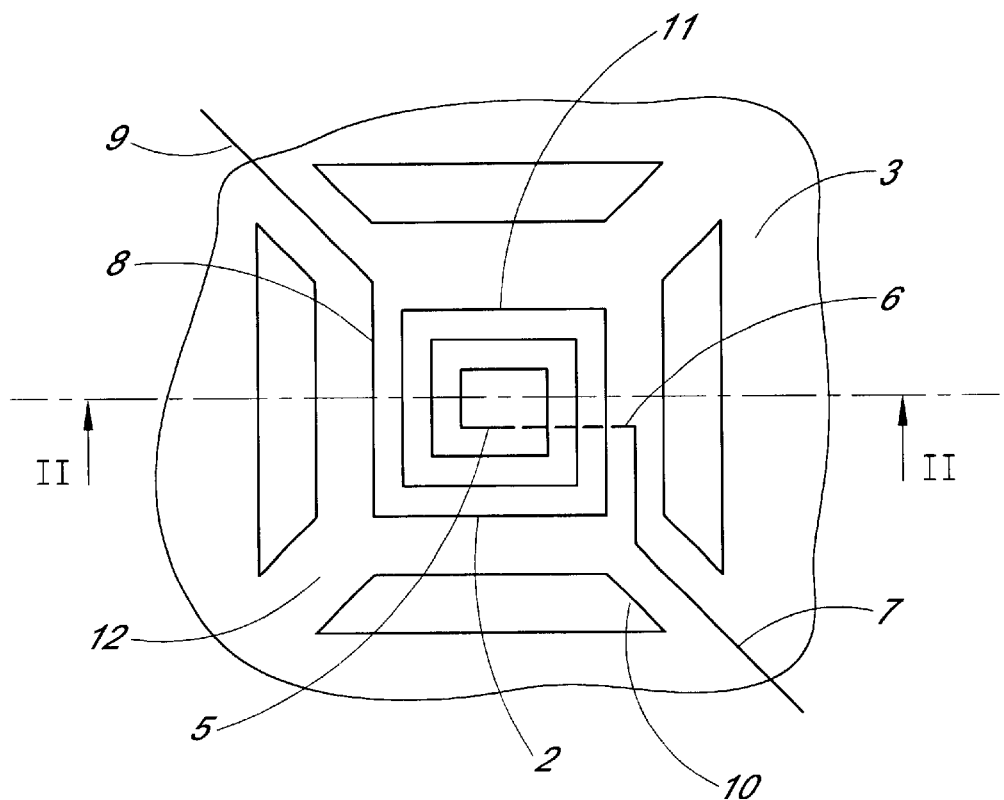
FIG. 1 is a plan view of an integrated circuit inductor in the prior art.
Figure 2:
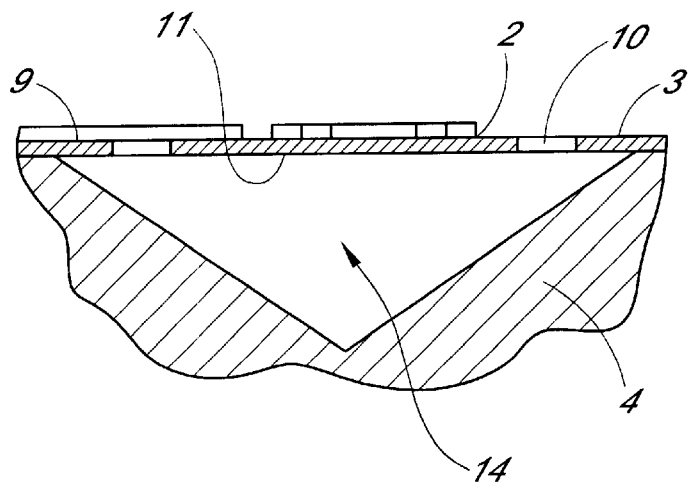
FIG. 2 is a cross-sectional view of the inductor on the line II—II in FIG. 1.
Figure 3:
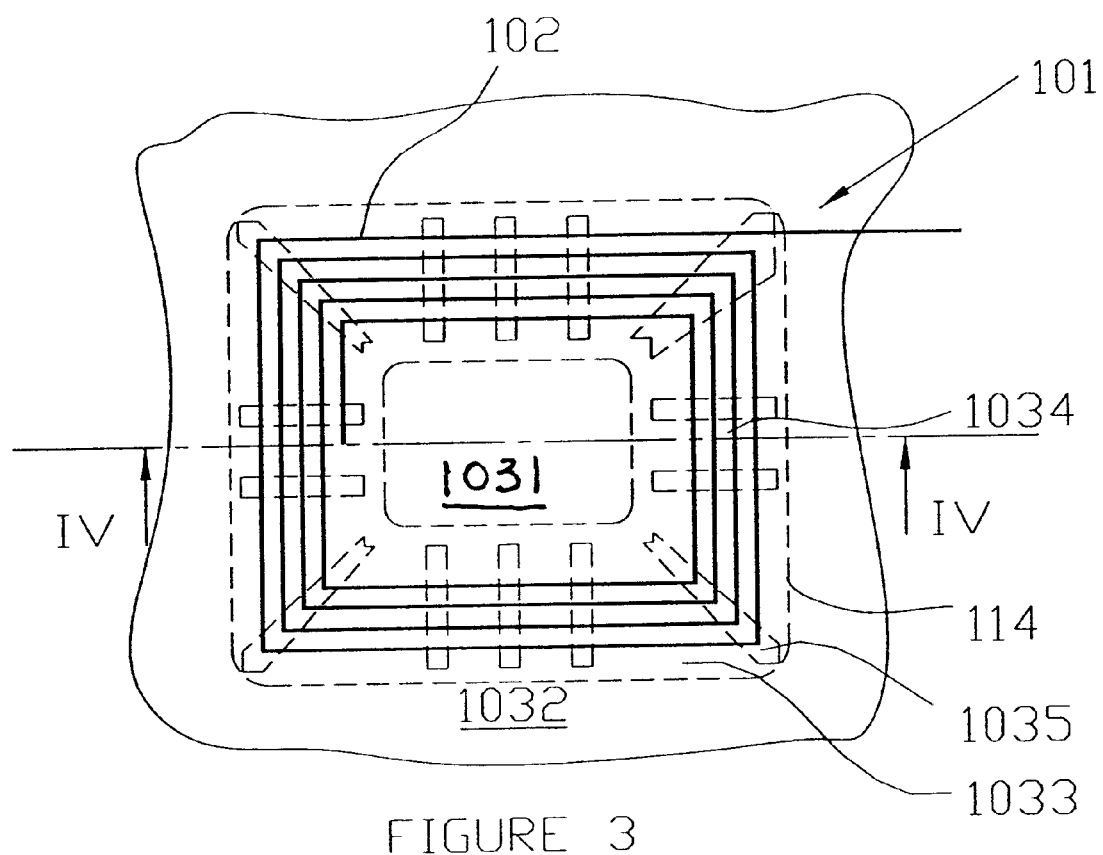
FIG. 3 is a plan view of an integrated circuit inductor according to one embodiment of the invention.

FIG. 3 is a plan view of an integrated circuit inductor 101 according to one embodiment of the invention.

Figure 4:
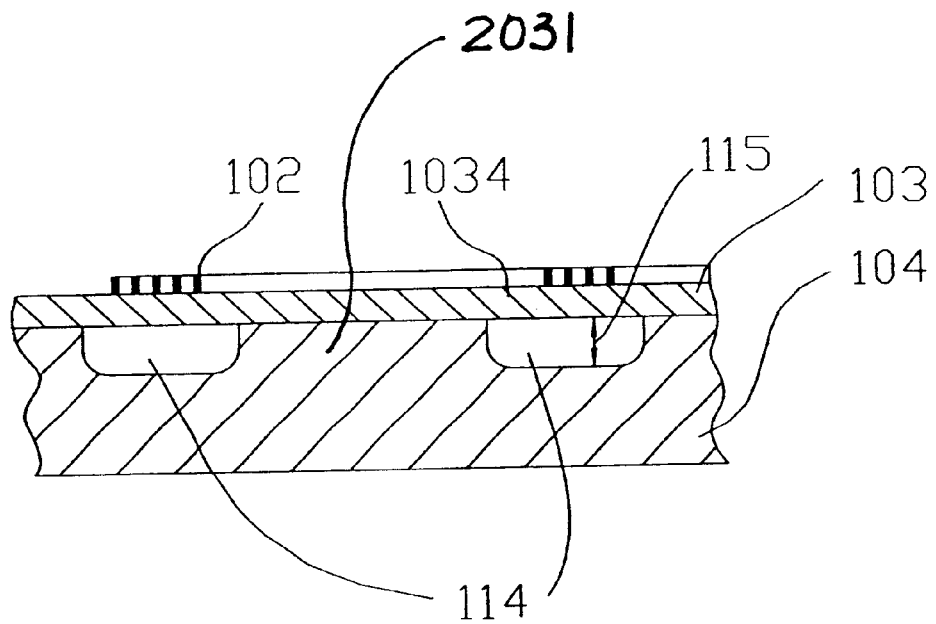
FIG. 4 is a cross-sectional view of the inductor on the line IV—IV in FIG. 3.

FIG. 4 is a cross-sectional view of the inductor 101 on the line IV—IV in FIG. 3.

Referring to FIGS. 3 and 4, the inductor 101 of the invention has a spiral aluminum track 102. The track 102 is deposited on an oxide layer 103 over a silicon substrate 104. The substrate 104 is etched away to form a trench 114, which extends around beneath the track 102, and provides an air gap 115 having a low dielectric constant.

The oxide layer 103 has an inner region 1031 within the track 102, an outer region 1032 outside the track 102, and a bridging region 1033 extending between the other regions. The bridging region 1033 is comprised of intact bridges 1034 and apertures 1035 therebetween, which are open to the trench 114 and through which an etchant has access to the silicon substrate 104 to form the trench 114 by etching. Reference numeral 2031 indicates a substrate pillar supporting the inner region 1031 of the oxide layer 103.

FIGS. 5(i) to 5(vii) illustrate a series of steps in the production of the inductor 101 of FIG. 3. Referring now to FIGS. 5(i) to 5(vii), a first oxide layer 1036 is first laid down on the silicon substrate 104, with a first metal layer 106 on top. As shown in FIG. 5(ii), the metal layer 106 is etched back to leave only a short track 1061, which will form an "underpass" connection to the inner end of the spiral track 102 of the inductor 101.

Additional oxide layer 1037, as shown in FIG. 5(iii), is deposited over the top of the bottom layer 1036 to at least temporarily enclose the bottom layer. Then, via a temporary mask 140, as shown in FIG. 5(iv), vias 141 are etched to the underpass track 1061. With the mask removed again, as shown in FIG. 5(v), a further metal 1021 is deposited to fill the vias 141 and provide metal for the spiral track 102. For the definition of this, as shown in FIG. 5(vi), another mask 142 is laid down, and the metal between the tracks 102 is removed. The mask is removed. At this stage, the metal of the track 102 is fully defined.

Now as shown in FIG. 5(vii), a further mask 143 is laid down, to etch away gaps 1035 in the oxide, that is in both the first and second layers 1036, 1037, down to the silicon substrate 104. The bridges 1034 from the central region 1031 to the circumferential regions 1032 are left intact, with the conductive track 102 spanning from one bridge to the next. Finally, the silicon substrate 104 beneath the gaps 1035 is etched away. The etching is continued until the voids formed beneath the track 102 coalesce to form the trench 114.

Figure 6:
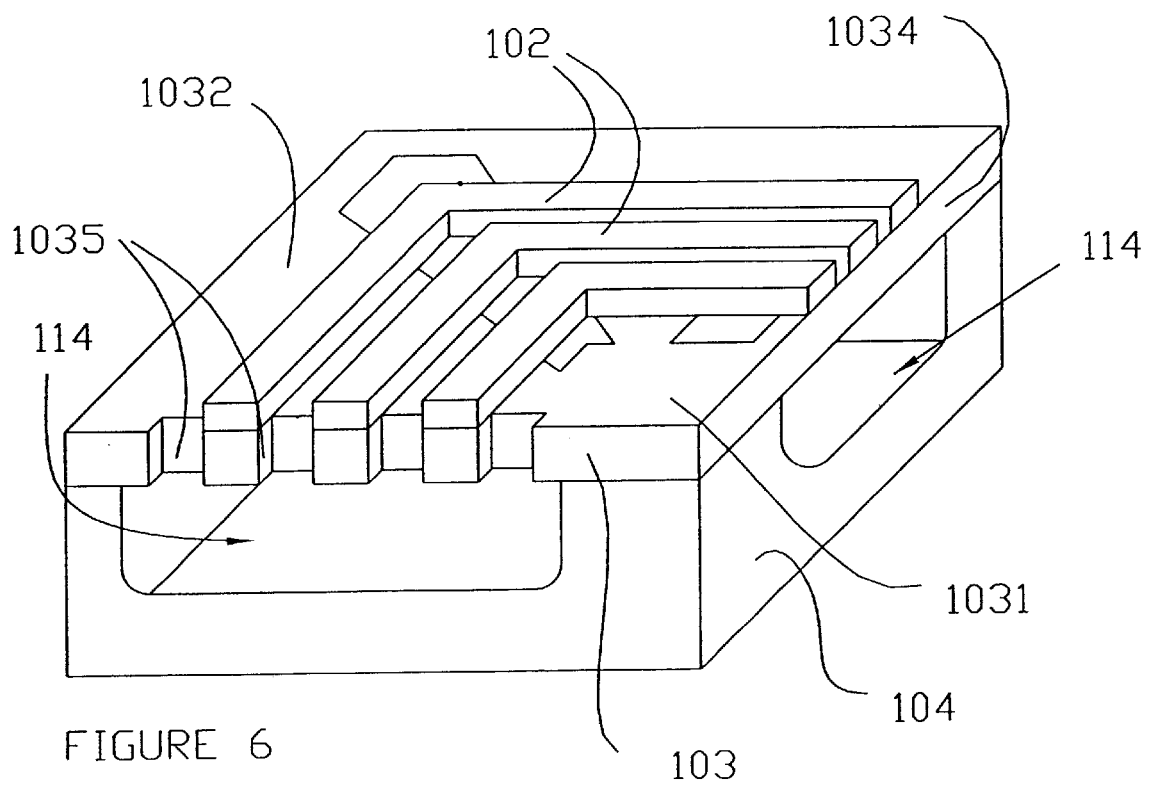
FIG. 6 is a perspective view of a comer portion of the inductor of FIG. 3.

FIG. 6 shows a perspective view of the trench 114 under a corner portion of the inductor 101. Since the etching of the substrate 104 is carried out from directly above the place where the trench 114 is to be formed, as opposed to being carried out from outside the inductor as in the prior art referred above, no extra area is consumed. Further, the etching is fully CMOS compatible in the use of CMOS RIE tools and gases such as $SF_6$, He, $O_2$, etc.

As can be seen from FIGS. 3, 4, and 6, the integrated inductor 101 of one embodiment of the invention is only partially separated from the substrate 104. That is, the inner region 1031, which has no inductive loops, is positioned on the substrate 104 with no spacing. The integrated inductor 101 is, in fact, "bridging" across the trench 114, with only inductive loop 102 positioned over the substrate 104.

The material details of the above steps are the same as those employed in CMOS technology, and as such are familiar to those skilled in the art, will not be described in more detail. Certain of the described steps will be useful in the formation of other components elsewhere on the substrate; and indeed other steps may be incorporated in the process for forming components elsewhere without interfering with the formation of the inductor.

Utilizing the invention, an inductor is achieved that has a low parasitic capacitance and a Q value of 15 at 1.9 GHz.

The integrated inductor of one embodiment of the invention produces the following advantages. First, the manufacturing process of the integrated inductor is compatible with that of CMOS. Second, the integrated inductor is mechanically more stable because of the "pillar" support. Third, the substrate is less consumed; therefore the structure is etchant and material-saving, and the manufacturing process is more efficient.

What is claimed is:

1. An integrated circuit inductor, the integrated circuit having a silicon substrate and an oxide layer on the silicon substrate, the inductor comprising:
   an inductive loop deposited on the oxide layer;
   a plurality of apertures in the oxide layer beneath the inductive loop;
   a plurality of bridges adjacent the apertures and provided by portions of the oxide layer between an inner region and an outer region of the oxide layer, respectively within and without the inductive loop, the loop being supported on the bridges; and
   a trench formed in the silicon substrate beneath the bridges, to provide an air gap between the inductive loop and the silicon substrate.

2. The integrated circuit inductor as claimed in claim 1, wherein the apertures and the bridges extend generally radially from the inner region.

3. The integrated circuit inductor as claimed in claim 1, wherein the trench extends circumferentially around the inner region.

4. The integrated circuit inductor as claimed in claim 2, wherein the trench extends circumferentially around the inner region.

5. The integrated circuit inductor as claimed in claim 1, wherein the inductive loop has a plurality of spirally arranged turns.

6. The integrated circuit inductor as claimed in claim 2, wherein the inductive loop has a plurality of spirally arranged turns.

7. The integrated circuit inductor as claimed in claim 3, wherein the inductive loop has a plurality of spirally arranged turns.

8. The integrated circuit inductor as claimed in claim 1, wherein the oxide layer includes an underpass connection in one of the bridges from a peripheral connection to another end of the inductor to its inner end.

9. An integrated circuit inductor, the integrated circuit having a silicon substrate and an oxide layer on the silicon substrate, the inductor comprising:
   an inductive loop deposited on the oxide layer;
   a plurality of apertures in the oxide layer beneath the inductive loop, each aperture forming an underpass to a plurality of segments of the inductive loop;
   a plurality of bridges adjacent the apertures and provided by portions of the oxide layer between an inner region and an outer region of the oxide layer, respectively within and without the inductive loop, the loop being supported on the bridges; and
   a trench formed in the silicon substrate beneath the bridges, to provide an air gap between the inductive loop and the silicon substrate.

\* \* \* \* \*